(12) United States Patent
Shimizu et al.

(10) Patent No.: US 11,777,286 B2
(45) Date of Patent: Oct. 3, 2023

(54) ELECTROMAGNETIC SHIELD MEMBER AND WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Takeshi Shimizu, Yokkaichi (JP); Tomoya Kawaguchi, Yokkaichi (JP)

(73) Assignees: AUTONETWORKS TECHNOLOGIES, LTD., Mie-ken (JP); SUMITOMO WIRING SYSTEMS, LTD., Mie-ken (JP); SUMITOMO ELECTRIC INDUSTRIES, LTD., Osaka (JP)

(*) Notice: Subject to any disclaimer, the term of this patent is extended or adjusted under 35 U.S.C. 154(b) by 199 days.

(21) Appl. No.: 17/428,985

(22) PCT Filed: Nov. 25, 2019

(86) PCT No.: PCT/JP2019/045941
§ 371 (c)(1),
(2) Date: Aug. 6, 2021

(87) PCT Pub. No.: WO2020/161993
PCT Pub. Date: Aug. 13, 2020

(65) Prior Publication Data
US 2022/0131351 A1 Apr. 28, 2022

(30) Foreign Application Priority Data
Feb. 8, 2019 (JP) .................................. 2019-021464

(51) Int. Cl.
*H02G 3/04* (2006.01)
*H02G 3/03* (2006.01)
(Continued)

(52) U.S. Cl.
CPC ............. *H02G 3/0406* (2013.01); *H02G 3/03* (2013.01); *H02G 3/0437* (2013.01); *H05K 9/0049* (2013.01); *B60R 16/0215* (2013.01)

(58) Field of Classification Search
CPC .................................. H01B 7/184; H02G 3/03
(Continued)

(56) References Cited

U.S. PATENT DOCUMENTS 349,893 A * 9/1886 McGill ................ H02G 3/0487
174/99 R
1,606,810 A * 11/1926 Saylor ...................... H02G 3/02
174/124 R
(Continued)

FOREIGN PATENT DOCUMENTS

JP 02114811 A * 4/1990
JP H02-125387 U 10/1990
(Continued)

*Primary Examiner* — Krystal Robinson

(57) ABSTRACT

An embodiment of the present disclosure provides an electromagnetic shield member that can improve heat dissipation from an electric wire, and a wire harness that includes the electromagnetic shield member. An electromagnetic shield member has rectangular tubular housing portions in which electric wires are individually housed. The housing portions are provided with pressing portions that are formed by cutting and raising portions of the housing portions inward, and that press the electric wires.

4 Claims, 4 Drawing Sheets

(51) Int. Cl.
*H05K 9/00* (2006.01)
*B60R 16/02* (2006.01)

(58) Field of Classification Search
USPC .......................................................... 174/95
See application file for complete search history.

(56) References Cited

U.S. PATENT DOCUMENTS

| | | | | |
|---|---|---|---|---|
| 2,087,640 A * | 7/1937 | Du Prey | ............... | H02G 3/0437 |
| | | | | 24/339 |
| 2,170,298 A * | 8/1939 | Frank | ...................... | H02G 5/04 |
| | | | | 105/154 |
| 3,233,851 A * | 2/1966 | Lemieux | ............. | H02G 3/0437 |
| | | | | D8/394 |
| 3,798,346 A * | 3/1974 | Kreuzer | ................ | H01B 7/426 |
| | | | | 174/15.6 |
| 3,936,024 A * | 2/1976 | Jung | .................... | H02G 3/0437 |
| | | | | 211/193 |
| 5,120,903 A * | 6/1992 | Tam | ..................... | H05K 9/0015 |
| | | | | 277/650 |
| 5,534,665 A * | 7/1996 | Long | .................. | B60R 16/0215 |
| | | | | 174/72 A |
| 5,668,910 A * | 9/1997 | Arnett | ................. | G02B 6/4457 |
| | | | | 385/136 |
| 5,780,773 A * | 7/1998 | Wakamatsu | ......... | H02G 3/0475 |
| | | | | 174/95 |
| 6,027,679 A * | 2/2000 | O'Brien | ................. | B60R 16/02 |
| | | | | 29/451 |
| 6,383,014 B1 * | 5/2002 | Saito | .................. | B60R 16/0215 |
| | | | | 439/456 |
| 6,903,266 B1 * | 6/2005 | Luciere | ................ | H02G 3/0608 |
| | | | | 174/505 |
| 7,258,583 B1 * | 8/2007 | Baiza | ................... | H02G 11/006 |
| | | | | 174/72 A |
| 7,263,756 B2 * | 9/2007 | Sosnowski | ........... | H05K 9/0016 |
| | | | | 174/355 |
| 7,348,488 B2 * | 3/2008 | Benito-Navazo | ...... | H02G 3/045 |
| | | | | 174/72 A |
| 7,760,983 B2 * | 7/2010 | Jadaud | ..................... | H02G 3/32 |
| | | | | 248/62 |
| 8,575,487 B2 * | 11/2013 | Agusa | ................. | B60R 16/0215 |
| | | | | 174/72 A |
| 8,609,986 B2 * | 12/2013 | Edmond | .................. | H02G 3/32 |
| | | | | 174/95 |
| 9,062,802 B2 * | 6/2015 | Lairie | ................ | B65D 63/1009 |
| 11,258,240 B1 * | 2/2022 | White | ..................... | H02G 3/30 |
| 2002/0098717 A1 | 7/2002 | Matsuda et al. | | |
| 2005/0045357 A1 * | 3/2005 | Ichikawa | ............. | H02G 3/0431 |
| | | | | 174/50 |
| 2009/0067131 A1 | 3/2009 | Yasuda et al. | | |
| 2013/0313376 A1 * | 11/2013 | Shirey | ................ | B60R 16/0215 |
| | | | | 248/65 |

FOREIGN PATENT DOCUMENTS

| | | | |
|---|---|---|---|
| JP | H03-51200 U | | 5/1991 |
| JP | 07245839 A | * | 9/1995 |
| JP | 2002-135941 A | | 5/2002 |
| JP | 2004-289525 A | | 10/2004 |
| JP | 2005-044607 A | | 2/2005 |
| JP | 2009-232561 A | | 10/2009 |

* cited by examiner

ELECTROMAGNETIC SHIELD MEMBER AND WIRE HARNESS

BACKGROUND

Field of the Disclosure

The present disclosure relates to an electromagnetic shield member and a wire harness.

Related Art

Conventionally, a wire harness applied to a vehicle such as an electric vehicle includes a plurality of electric wires and an electromagnetic shield member that is conductive and performs electromagnetic shielding by individually covering each of the plurality of electric wires (for example, see Japanese Laid-Open Patent Publication No. 2005-44607A). The electromagnetic shield member disclosed in Patent Document 1 includes a shield protector that has groove-shaped housing portions that can individually house electric wires, and a cover that closes the groove-shaped housing portions. Each electric wire is electromagnetically shielded as a result of the outer circumference thereof being covered by the shield protector and the cover.

Conventional electromagnetic shield members, including the electromagnetic shield member disclosed in Patent Document 1, and wire harnesses provided with such an electromagnetic shield member are desired to have improved heat dissipation properties. In particular, in a wire harness in which an electric wire is connected to a high-voltage electric device such as an inverter, a problem caused by heat generated by the electric wire is significant because the current flowing through the electric wire is large.

An object of the present disclosure is to provide an electromagnetic shield member and a wire harness that can improve heat dissipation from an electric wire.

SUMMARY

An electromagnetic shield member for achieving the above-described object has a tubular housing portion in which an electric wire is to be individually housed, and the housing portion is provided with a pressing portion that is formed by cutting and raising a portion of the housing portion inward, and that is configured to press the electric wire.

With this configuration, the housing portion of the electromagnetic shield member is provided with a pressing portion that presses an electric wire, and therefore the electric wire is pressed by the pressing portion as a result of the electric wire being housed in the housing portion. Therefore, it is possible to increase the degree of contact between the outer circumferential surface of the electric wire and the inner circumferential surface of the housing portion. As a result, heat from the electric wire is likely to be dissipated to the outside via the housing portion including the pressing portion.

In addition, as a result of the pressing portion being formed in the housing portion, a through hole that communicates with the inside and the outside of the housing portion is formed. Therefore, the heat from the electric wire is less likely to be trapped inside the housing portion, and is likely to be dissipated to the outside of the housing portion via the through hole. Therefore, it is possible to improve heat dissipation from the electric wire.

In some examples in the present disclosure, the housing portion is constituted by a case that has a groove that houses the electric wire, and a cover that is attached to the case and covers the groove, and the pressing portion is formed in either a bottom wall of the case or a facing wall of the cover, the facing wall facing the bottom wall of the case.

With this configuration, as a result of the cover being attached to the case that has a groove, the electric wire is enclosed by the groove of the case and the cover, and the electric wire is electromagnetically shielded. In addition, the pressing portion that is a cut and raised portion is formed in either a bottom wall of the case or a facing wall of the cover. Therefore, as a result of the cover being attached to the case in which each electrical wire is housed, the electric wire is pressed by the pressing portion toward the case or the cover. As a result, it is possible to simultaneously perform an operation to attach the cover to the case and an operation to bring the pressing portion into contact with the outer circumferential surface of the electric wire.

Here, air is more likely to move upward as the temperature thereof increases. Therefore, for example, by orientating the electromagnetic shield member such that the pressing portion is located on the upper side, the heat from the electric wire is likely to be dissipated to the outside of the housing portion via the through hole formed in the housing portion as a result of the pressing portion that is a cut and raised portion being formed. Therefore, it is possible to improve heat dissipation from the electric wire.

A wire harness for achieving the above-described object includes a plurality of electric wires and one of the above-described electromagnetic shield members.

With this configuration, it is possible to achieve the same operations and effects as the operations and effects of one of the above-described electromagnetic shield members.

The present disclosure can improve the heat dissipation from an electric wire.

DETAILED DESCRIPTION

Figure 1:
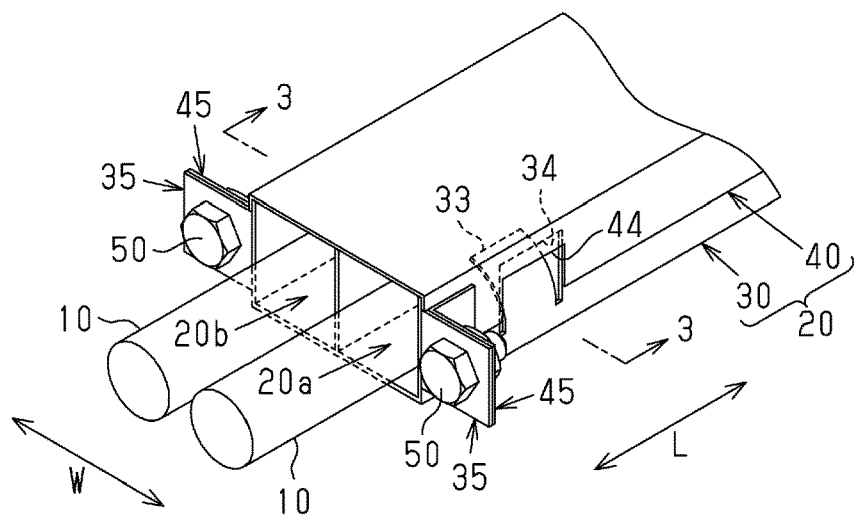
FIG. 1 is a partial perspective view of a wire harness according to a first embodiment.
Figure 2:
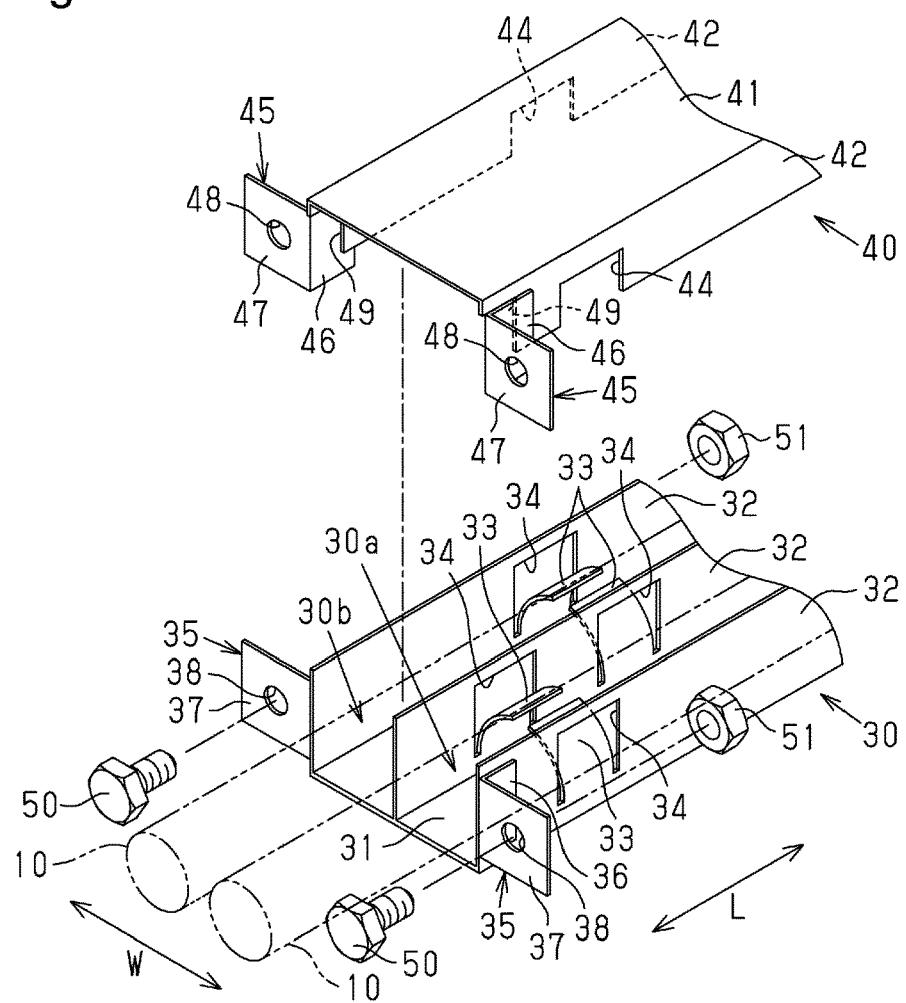
FIG. 2 is a partial exploded view of the wire harness according to the first embodiment.
Figure 3:
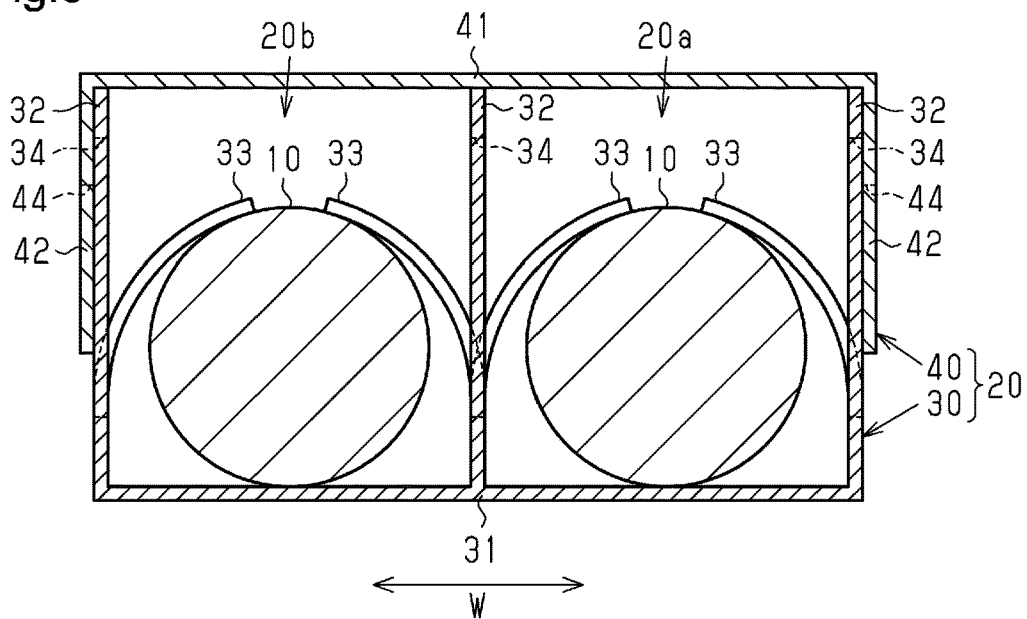
FIG. 3 is a cross-sectional view taken along a line 3-3 shown in FIG. 1.

The following describes a first embodiment of an electromagnetic shield member and a wire harness with reference to FIGS. 1 to 3. In the accompanying drawings, some parts of the configuration may be exaggerated or simplified for convenience of description. In addition, the dimensional ratio of each part may be different from the actual dimensional ratio.

The wire harness according to the present embodiment is routed along paths including a path under the floor of a vehicle such as a hybrid vehicle or an electric vehicle, and electrically connects a plurality of devices.

As shown in FIGS. 1 and 2, the wire harness includes two electric wires 10 arranged side by side, and a conductive electromagnetic shield member 20 that has rectangular tubular housing portions 20a and 20b in which the electric wires 10 are individually housed.

Each electric wire 10 has, for example, a conductive core wire and an insulating coating that covers the outer circumference of the core wire.

Hereinafter, the direction in which the electric wires 10 extend is referred to as a longitudinal direction L, and the direction that is orthogonal to the longitudinal direction L and in which the electric wires 10 are arranged side-by-side is referred to as a width direction W.

The electromagnetic shield member 20 has an elongated shape that extends in the longitudinal direction L, and is made of a metal material such as an aluminum alloy.

As shown in FIG. 2, the electromagnetic shield member 20 includes a case 30 that has two grooves 30a and 30b, and a cover 40 that is attached to the case 30 and covers the grooves 30a and 30b.

The case 30 has a bottom wall 31 that extends in the longitudinal direction L and a plurality of side walls 32. In the example shown in the drawing, the case 30 has three side walls 32 that respectively extend from the two ends in the width direction W and the center in the width direction W of the bottom wall 31. The side walls 32 extend over the entire length in the longitudinal direction L of the bottom wall 31.

The bottom wall 31 and the pair of side walls 32 that are adjacent to each other in the width direction W constitute the grooves 30a and 30b. In the present embodiment, the groove 30a and the groove 30b share the side wall 32 that is located at the center in the width direction W.

As shown in FIGS. 2 and 3, the pairs of side walls 32 respectively constituting the grooves 30a and 30b are each provided with pressing portions 33 that are formed by cutting and raising portions of the side walls inward, and that press the electric wire 10 housed in the housing portion 20a or 20b corresponding thereto. The pair of pressing portions 33 provided in the groove 30a are formed at the same position in the longitudinal direction L, and face each other in the width direction W. Similarly, the pair of pressing portions 33 provided in the groove 30b are formed at the same position in the longitudinal direction L, and face each other in the width direction W.

As shown in FIG. 3, each pressing portion 33 is cut and raised from a side wall 32, where the bottom wall 31 side is a base end and the side opposite to the bottom wall 31 side is a leading end. Each of the pressing portions 33 may be partially or fully curved so that a portion of the pressing portion 33, such as a leading end portion thereof, extends along the outer circumferential surface of the electric wire 10. In the example shown in the drawing, each of the pressing portions 33 are curved so as to be located inward toward the tip end, that is, so as to approach the side wall 32 that the pressing portion 33 faces, or the bottom wall 31.

Also, as shown in FIGS. 2 and 3, through holes 34 that communicate with the inside and the outside of the housing portions 20a and 20b are formed in the pairs of side walls 32 constituting the grooves 30a and 30b, as a result of the pressing portions 33 being formed. As shown in FIG. 2, the width of each of the through holes 34 in the longitudinal direction L is slightly larger than the width of each of the pressing portions 33 in the longitudinal direction L.

The pair of pressing portions 33 of the groove 30a and the pair of pressing portions 33 of the groove 30b are formed at different positions of the case 30 in the longitudinal direction L. Therefore, in the side wall 32 located at the center in the width direction W, two pressing portions 33 that are cut and raised in different directions with respect to the width direction W are formed at different positions in the longitudinal direction L.

The case 30 has a pair of L-shaped brackets 35 that are joined to the side walls 32 at the two ends in the width direction W, from the outside. Each bracket 35 includes a joint portion 36 that is joined to one end of the aforementioned side wall 32 in the longitudinal direction L, and an attachment portion 37 that is bent from one end of the joint portion 36 in the longitudinal direction L. Each attachment portion 37 is provided with an attachment hole 38 that penetrates therethrough in the longitudinal direction L. Note that the attachment portions 37 are flush with the end surfaces of the side walls 32 in the longitudinal direction L.

As shown in FIGS. 1 and 2, the cover 40 includes a facing wall 41 that extends in the longitudinal direction L and faces the bottom wall 31 of the case 30, and two side walls 42 that protrude from the two ends of the facing wall 41 in the width direction W. The side walls 42 extend over the entire length in the longitudinal direction L of the facing wall 41.

As shown in FIG. 3, the side walls 42 of the cover 40 cover the side walls 32 at two ends of the case 30 in the width direction W from the outside in the width direction W.

As shown in FIGS. 1 to 3, a cutout portion 44 is formed at a midpoint of each side wall 42 in the longitudinal direction L. Each cutout portion 44 is formed at a position corresponding to two through holes 34 formed in side walls 32 at the two ends of the case 30 in the width direction W. Therefore, as with these two through holes 34, the cutout portions 44 are formed at different positions of the side walls 42 in the longitudinal direction L. The width of each cutout portion 44 in the longitudinal direction L is the same as, or is slightly larger than, the width of each through hole 34 in the longitudinal direction L. Due to the presence of the through holes 34 and the cutout portions 44, the inside and the outside of the housing portions 20a and 20b communicate with each other.

The cover 40 has a pair of L-shaped brackets 45 that are joined to the side walls 42 at the two ends in the width direction W, from the outside. Each bracket 45 includes a joint portion 46 that is joined to one end of the aforementioned side wall 42 in the longitudinal direction L, and an attachment portion 47 that is bent from one end portion of the joint portion 46 in the longitudinal direction L. Each attachment portion 47 is provided with an attachment hole 48 that penetrates therethrough in the longitudinal direction L.

Here, as shown in FIG. 2, one end portion of each side wall 42 in the longitudinal direction L is provided with a release portion 49 for releasing the joint portion 36 of the bracket 35 of the case 30 when the cover 40 is attached to the case 30, formed by cutting out a portion of the one end portion. The joint portions 46 of the brackets 45 cover the release portions 49 from the outside in the width direction W.

The brackets 35 of the case 30 and the brackets 45 of the cover 40 are placed so as to overlap each other in the longitudinal direction L, nuts 51 are screwed onto bolts 50 inserted into the attachment holes 38 of the brackets 35 and the attachment holes 48 of the brackets 45, and thus the cover 40 is attached to the case 30. In the present embodiment, the housing portions 20a and 20b are constituted by the grooves 30a and 30b and the facing wall 41.

The following describes the operations and effects of the present embodiment.

The electromagnetic shield member 20 has rectangular tubular housing portions 20a and 20b that are configured to house the electric wires 10. The housing portions 20a and 20b are provided with pressing portions 33 that are formed by cutting and raising portions of the side walls inward, and that press the electric wires 10.

With such a configuration, the housing portions 20a and 20b of the electromagnetic shield member 20 are provided with the pressing portions 33 for pressing the electric wires 10, and therefore, as a result of housing the electric wires 10 in the housing portions 20a and 20b, the electric wires 10 are pressed by the pressing portions 33. Therefore, it is possible to increase the degree of contact between the outer circumferential surfaces of the electric wires 10 and the inner circumferential surfaces of the housing portions 20a and 20b. As a result, heat from the electric wires 10 is more likely to be dissipated to the outside via the housing portions 20a and 20b including the pressing portions 33. For example, the pressing portions 33 contribute to increasing the contact area between the electric wires 10 and the electromagnetic shield member 20. Therefore, the efficiency of heat conduction from the electric wires 10 to the electromagnetic shield member 20 is improved. The heat is dissipated to the outside of the electromagnetic shield member 20.

In addition, as a result of the pressing portions 33 being formed in the housing portions 20a and 20b, through holes 34 that communicate with the inside and the outside of the housing portions 20a and 20b are formed. Therefore, heat from the electric wires 10 is less likely to be trapped inside the housing portions 20a and 20b, and is likely to be dissipated to the outside of the housing portions 20a and 20b via the through holes 34. Therefore, it is possible to improve heat dissipation from the electric wires 10.

The electromagnetic shield member 20 is constituted by the case 30 and the cover 40 attached to the case 30, and the pressing portions 33 are provided in the side walls 32 of the case 30.

With such a configuration, the case 30 and the cover 40 are formed as separate members. Therefore, it is easy to perform work to route the electric wires 10 between the pressing portions 33 and the bottom wall 31 of the case 30 so that the electric wires 10 are pressed by the pressing portions 33.

The groove 30a and the groove 30b share the side wall 32 that is located at the center in the width direction W. In the side wall 32, two pressing portions 33 that are cut and raised in different directions with respect to the width direction W are formed at different positions in the longitudinal direction L.

With such a configuration, one side wall of the two housing portions 20a and 20b can be constituted by one side wall 32, and a plurality of pressing portions 33 can be formed in the side wall 32. Therefore, it is possible to suppress an increase in the size of the electromagnetic shield member 20 in the width direction W compared to a configuration in which the two housing portions do not share one side wall, i.e., the two housing portions are respectively partitioned by different side walls.

A wire harness includes two electric wires 10 and the electromagnetic shield member 20.

With such a configuration, it is possible to achieve the same operations and effects as in the above-described operations and effects (1).

Figure 4:
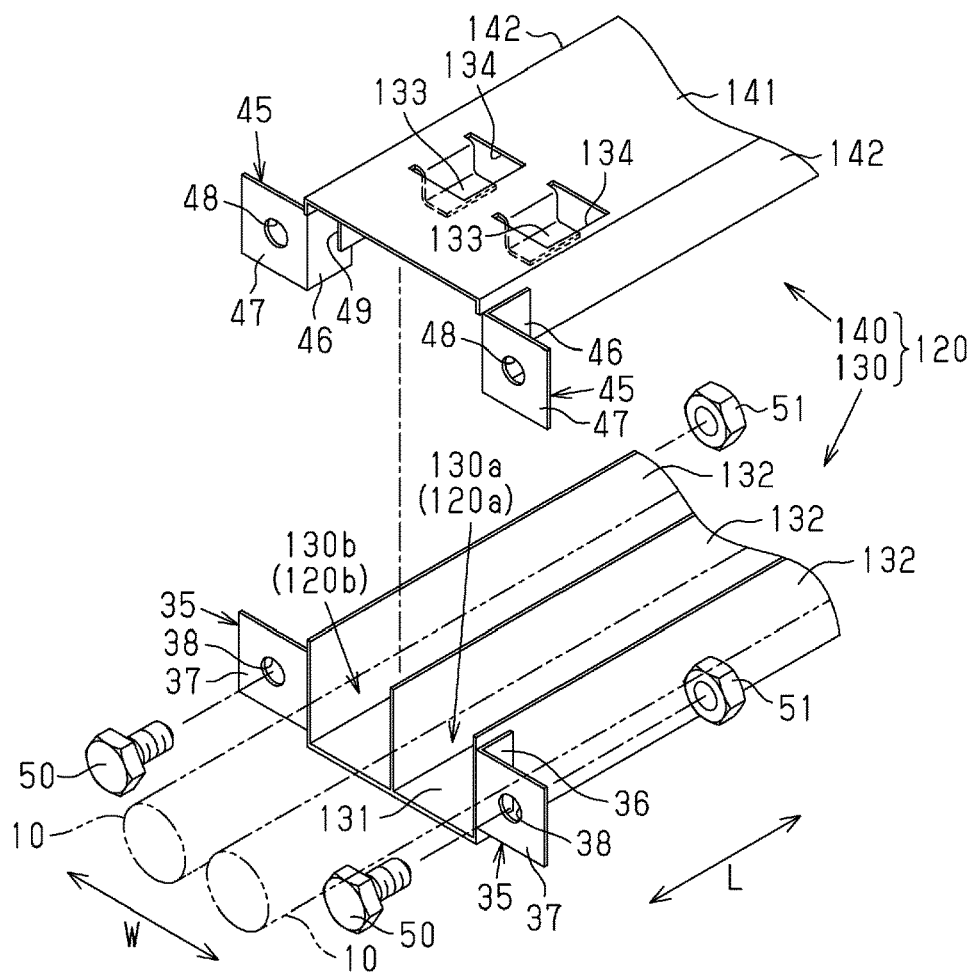
FIG. 4 is a partial perspective view of the wire harness according to a second embodiment.
Figure 5:
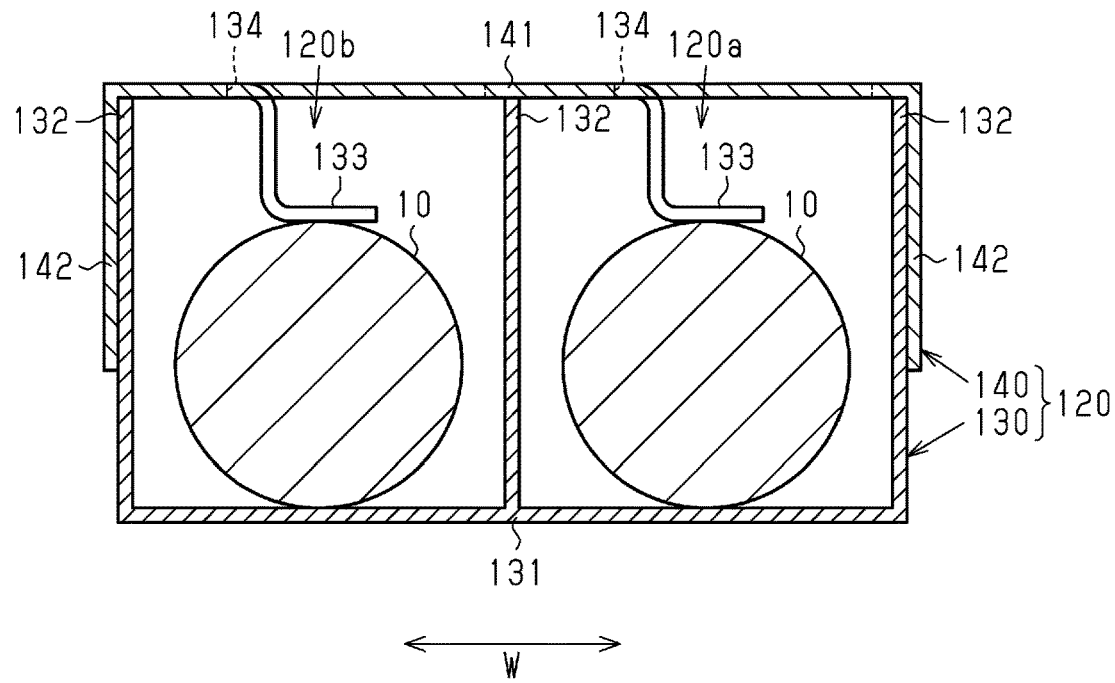
FIG. 5 is a cross-sectional view of the wire harness according to the second embodiment corresponding to FIG. 3.

The following describes a second embodiment with reference to FIGS. 4 and 5, mainly regarding differences from the first embodiment.

Note that, in the present embodiment, duplicate descriptions may be omitted by assigning the same reference numerals to the same components as those in the first embodiment, and assigning reference numerals "1", which are obtained by adding "100" to the reference numerals "**" in the first embodiment, to the components corresponding to those in the first embodiment.

As shown in FIGS. 4 and 5, an electromagnetic shield member 120 according to the present embodiment includes a case 130 and a cover 140 that are similar to those in the first embodiment.

However, in the present embodiment, pressing portions 133 are formed only in the portions that constitute housing portions 120a and 120b, of a facing wall 141 of the cover 140. The pressing portions 133 are bent from the facing wall 141 and extend toward a bottom wall 131 of the case 130, and the leading end portions thereof are further bent and extend toward one side in the width direction W. As a result of the pressing portions 133 being formed in the facing wall 141, through holes 134 that communicate with the inside and the outside of the housing portions 120a and 120b are formed therein. Note that the width of each of the through holes 134 in the longitudinal direction L is slightly larger than the width of each of the pressing portions 133 in the longitudinal direction L.

The pressing portions 133 are formed at the same position in the longitudinal direction L. Note that the pressing portions 133 may be formed at different positions in the longitudinal direction L.

As shown in FIG. 5, the outer circumferential surfaces of the electric wires 10 are pressed toward the bottom wall 131 by the leading end portions that extend to one side in the width direction W, of the pressing portions 133.

The following describes the operations and effects of the present embodiment.

The housing portions 120a and 120b are constituted by the case 130 that has grooves 130a and 130b that house the electric wires 10, and the cover 140 that is attached to the case 130 and covers the grooves 130a and 130b. The pressing portions 133 are formed in the facing wall 141 of the cover 140 that faces the bottom wall 131 of the case 130.

With such a configuration, as a result of the cover 140 being attached to the case 130 that has the grooves 130a and 130b, the electric wires 10 are enclosed by the case 130 and the cover 140, and the electric wires 10 are electromagnetically shielded. The pressing portions 133 are formed in the facing wall 141 of the cover 140. Therefore, as a result of the cover 140 being attached to the case 130 that houses the electric wires 10, the pressing portions 133 press the electric wires 10 toward the bottom wall 131 of the case 130. As a result, it is possible to simultaneously perform an operation to attach the cover 140 to the case 130 and an operation to press the electric wires 10 using the pressing portions 133.

Here, air is more likely to move upward as the temperature thereof increases. Therefore, for example, by orientating the electromagnetic shield member 120 such that the pressing portions 133 are located on the upper side, heat from the electric wires 10 is more likely to be dissipated to the outside of the housing portions 120a and 120b via the through holes 134 formed in the housing portions 120a and 120b as a result of the pressing portions 133 being formed. Therefore, it is possible to improve heat dissipation from the electric wires 10.

A wire harness includes two electric wires 10 and the electromagnetic shield member 120.

With such a configuration, it is possible to achieve the same operations and effects as in the above-described operations and effects (5).

The present embodiment may be implemented with the following modifications. The embodiments and the following modifications may be implemented in combination with each other as long as no technical contradiction arises.

Figure 6:
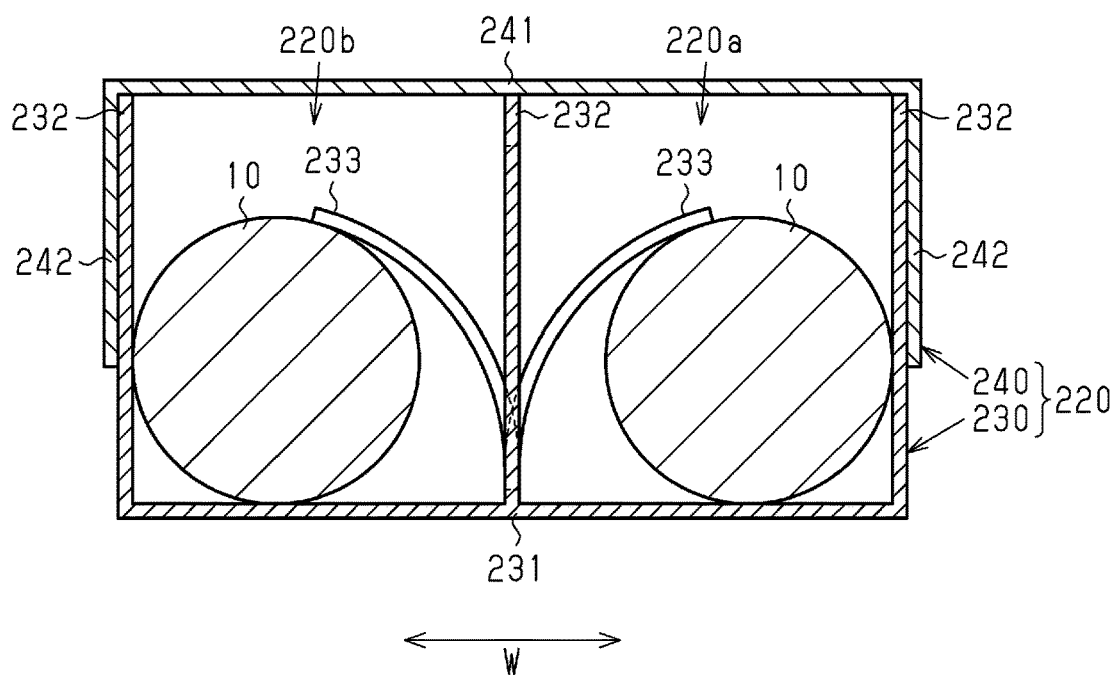
FIG. 6 is a cross-sectional view corresponding to FIG. 3 of a wire harness according to a first modification.
Figure 7:
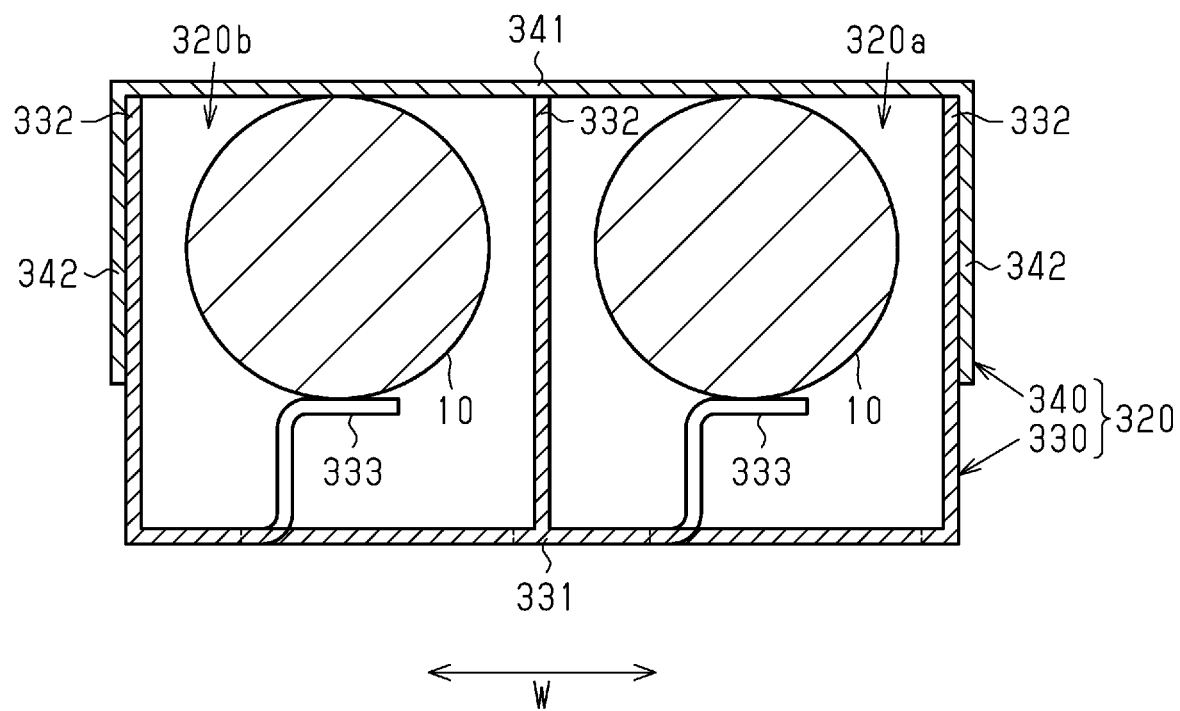
FIG. 7 is a cross-sectional view corresponding to FIG. 3 of a wire harness according to a second modification.

Note that, in the following first and second modifications shown in FIGS. 6 and 7, duplicate descriptions are omitted by assigning the same reference numerals to the same components as those in the above embodiments, and assigning reference numerals obtained by adding "200" and "300", to the components corresponding to those in the above embodiments.

- In the first embodiment, each of the housing portions 20*a* and 20*b* is provided with pressing portions 33 on both sides in the width direction W. However, each of the housing portions 20*a* and 20*b* may be provided with a pressing portion on only one side in the width direction W. If this is the case, as shown in FIG. 6, if pressing portions 233 are configured to bring the outer circumferential surfaces of the electric wires 10 into close contact with a bottom wall 231 and side walls 232 that face the pressing portions 233, heat from the electric wires 10 is likely to be dissipated via housing portions 220*a* and 220*b* that include the pressing portions 233.
- In the second embodiment, pressing portions 333 may be provided on a bottom wall 331 of a case 330 as shown in FIG. 7. Even with such a configuration, it is possible to achieve the same operations and effects as in the above-described operations and effects (5).
- The wire harness may have three or more electric wires and three or more housing portions that individually house the plurality of electric wires.
- A cushioning material made of an elastic material such as an elastomer or rubber may be provided between each electric wire 10 and the pressing portion 33 corresponding thereto. With such a configuration, it is possible to prevent the pressing portions 33 from damaging the outer circumferential surface of the electric wires 10.
- A plurality of pressing portions 33 (133) may be provided in the longitudinal direction L of the electromagnetic shield member 20 (120).
- The electromagnetic shield member 20 (120) is not limited to being made of an aluminum alloy. Instead, for example, the electromagnetic shield member 20 (120) may be made of stainless steel or the like.
- The cross-sectional shape of each electric wire 10 taken along a plane that is orthogonal to the longitudinal direction L may be any shape such as a semicircular shape or a polygonal shape.
- The mounting orientation of the wire harness is not limited to the orientation described in the above embodiment, and may be changed as appropriate.

The present disclosure includes the following implementation examples. Reference numerals are assigned to some of the components of the exemplary embodiments, not for limitation, but as an aid to understanding.

[Supplementary Note 1] One or more implementation examples of the present disclosure is directed to an electromagnetic shield member (20) that is configured to electromagnetically shield a predetermined length portion of an electric wire (10), and the electromagnetic shield member (20) may include:

- a housing chamber (20*a*) configured to house the predetermined length portion of the electric wire (10);
- a metal wall (32; 141; 243; 331) that constitutes an inwardly facing surface of the housing chamber (20*a*); and
- a metal pressing plate (33; 133; 233; 333) that includes a base end portion and a leading end portion, the metal pressing plate (33; 133; 233; 333) being configured to press the electric wire (10) housed in the housing chamber (20*a*) toward the inwardly facing surface of the housing chamber (20*a*),
- wherein the metal wall (32; 141; 243; 331) may be a first portion of a single metal member, and the metal pressing plate (33; 133; 233; 333) may be a second portion of the single metal member.

[Supplementary Note 2] In one or more implementation examples of the present disclosure, the housing chamber (20*a*) may be constituted by a groove (30*a*) that has an open end from which the electric wire (10) is led out in a longitudinal direction (L), and a metal cover (40) that is configured to cover the groove (30*a*) except the open end, and an end surface of the metal wall (32; 141; 243; 331) may be configured to be in contact with, and support, the metal cover (40) that covers the groove (30*a*).

[Supplementary Note 3] The groove (130*a*) may be configured such that the predetermined length portion of the electric wire (10) can be inserted into the groove (130*a*) in a radial direction of the electric wire (10) or a lateral direction.

[Supplementary Note 4] In one or more implementation examples of the present disclosure, the electric wire (10) may have a first (e.g., circular) cross-sectional shape, the housing chamber (20*a*) may have a second (e.g., rectangular) cross-sectional shape that is different from the first cross-sectional shape, and an empty space may be formed between the inwardly facing surface of the housing chamber (20*a*) and an outwardly facing surface of the electric wire (10).

[Supplementary Note 5] In one or more implementation examples of the present disclosure, a base end portion of the metal pressing plate (33; 133; 233; 333) may be a fixed end that is continuous with the metal wall (32; 141; 243; 331), and the leading end portion of the metal pressing plate (33; 133; 233; 333) may be a free end that is separate from the metal wall (32; 141; 243; 331).

[Supplementary Note 6] In one or more implementation examples of the present disclosure, the metal pressing plate (33; 233) may be a curved or curled metal plate.

[Supplementary Note 7] In one or more implementation examples of the present disclosure, the metal pressing plate (133; 333) may be a bent or folded metal plate.

[Supplementary Note 8] In one or more implementation examples of the present disclosure, in a cross-sectional view of the electric wire (10), the inwardly facing surface of the housing chamber (20*a*) and the metal pressing plate (33; 133; 233; 333) may be configured to cooperate to be in direct contact with the outwardly facing surface of the electric wire (10) at a plurality of circumferential positions that are separate from each other in a circumferential direction.

[Supplementary Note 9] In one or more implementation examples of the present disclosure, the metal pressing plate (33; 133; 333) may be configured to be in direct contact with an outer surface of the electric wire (10) at a first circumferential position, and the inwardly facing surface of the housing chamber (20*a*) may be configured to be in direct contact with the outer surface of the electric wire (10) at a second circumferential position that is separate from the first circumferential position.

[Supplementary Note 10] In one or more implementation examples of the present disclosure, the metal pressing plate (233) may be configured to be in direct contact with an outer surface of the electric wire (10) at a first circumferential position, and the inwardly facing surface of the housing chamber (20*a*) may be configured to be in direct contact with the outer surface of the electric wire (10) at a second circumferential position that is separate from the first circumferential position in a circumferential direction and at a third circumferential position that is separate from the first circumferential position and the second circumferential position in the circumferential direction.

[Supplementary Note 11] In one or more implementation examples of the present disclosure, the metal pressing plate (33; 133; 233; 333) may have an end edge or end surface that is formed by cutting and raising, or cutting and bending, the second portion of the single metal member, and the metal wall (32; 141; 243; 331) may have a through hole (34; 134) that corresponds to the end edge or the end surface of the metal pressing plate (33; 133; 233; 333).

[Supplementary Note 12] In one or more implementation examples of the present disclosure, the electric wire (10) may be a power line.

[Supplementary Note 13] In one or more implementation examples of the present disclosure, the housing chamber (20*a*) may be one of a plurality of housing chambers (20*a*, 20*b*) configured to individually house a plurality of electric wires (10).

It will be apparent to those skilled in the art that the present invention may be embodied in other specific forms as long as it does not depart from the technical concept thereof. For example, some of the parts described in the embodiments (or one or more aspects thereof) may be omitted, or some parts may be combined. The scope of the present invention should be determined with reference to the accompanying claims, along with the full scope of the equivalents to which the claims are entitled.

DESCRIPTION OF THE REFERENCE NUMERALS

10: Electric Wire
20, 120, 220, 320: Electromagnetic Shield Member
20*a*, 120*a*, 220*a*, 320*a*: Housing Portion
20*b*, 120*b*, 220*b*, 320*b*: Housing Portion
30, 130, 230, 330: Case
30*a*, 130*a*: Groove
30*b*, 130*b*: Groove
31, 131, 231, 331: Bottom Wall
32, 132, 232, 332: Side Wall
33, 133, 233, 333: Pressing Portion
34, 134: Through Hole
35: Bracket
36: Joint Portion
37: Attachment Portion
38: Attachment Hole
40, 140, 240, 340: Cover
41, 141, 241, 341: Facing Wall
42, 142, 242, 342: Side Wall
44: Cutout Portion
45: Bracket
46: Joint Portion
47: Attachment Portion
48: Attachment Hole
49: Release Portion
50: Bolt
51: Nut

The invention claimed is:

1. An electromagnetic shield member that has a tubular housing portion in which an electric wire is to be individually housed,
wherein the tubular housing portion is provided with a metal pressing portion that is formed by cutting and raising a portion of a metal wall that constitutes the tubular housing portion, inward, and that is configured to press the electric wire,
wherein the tubular housing portion is constituted by
a case that has a groove that houses the electric wire, and
a cover that is attached to the case and covers the groove, and
wherein the metal pressing portion is formed in either a bottom wall of the case or a facing wall of the cover, the facing wall facing the bottom wall of the case.

2. The electromagnetic shield member according to claim 1,
wherein a through hole that communicates with an inside and an outside of the tubular housing portion is formed in the tubular housing portion as a result of the metal pressing portion being cut and raised.

3. The electromagnetic shield member according to claim 1,
wherein the metal pressing portion presses the electric wire that is a heat generating element that generates heat due to a current passing through the electric wire.

4. A wire harness comprising:
a plurality of electric wires; and
an electromagnetic shield member according to claim 1.

* * * * *